United States Patent
Cho et al.

(10) Patent No.: US 8,674,232 B2
(45) Date of Patent: Mar. 18, 2014

(54) DEVICE-EMBEDDED FLEXIBLE PRINTED CIRCUIT BOARD AND MANUFACTURING METHOD THEREOF

(75) Inventors: Yang-sik Cho, Changwon (KR); Sung-taik Hong, Changwon (KR); Gun-ho Wang, Changwon (KR)

(73) Assignee: Samsung Techwin Co., Ltd., Changwon (KR)

( * ) Notice: Subject to any disclaimer, the term of this patent is extended or adjusted under 35 U.S.C. 154(b) by 397 days.

(21) Appl. No.: 13/116,224

(22) Filed: May 26, 2011

(65) Prior Publication Data
US 2012/0043114 A1 Feb. 23, 2012

(30) Foreign Application Priority Data
Aug. 17, 2010 (KR) .................. 10-2010-0079286

(51) Int. Cl.
*H05K 1/09* (2006.01)

(52) U.S. Cl.
USPC ........... 174/251; 174/250; 174/256; 174/261; 174/263; 361/600; 29/827; 257/200; 257/390; 257/738; 257/758; 438/128

(58) Field of Classification Search
USPC .......... 174/251, 250, 256, 261, 263; 361/600; 29/827; 257/200, 390, 738, 758; 438/128
See application file for complete search history.

(56) References Cited

U.S. PATENT DOCUMENTS

| | | | |
|---|---|---|---|
| 6,656,828 B1 * | 12/2003 | Maitani et al. | 438/613 |
| 7,129,584 B2 | 10/2006 | Lee | |
| 7,808,073 B2 * | 10/2010 | Wakisaka | 257/528 |
| 2007/0080458 A1 * | 4/2007 | Ogawa et al. | 257/750 |
| 2008/0105981 A1 * | 5/2008 | Kaneko | 257/758 |
| 2008/0203569 A1 * | 8/2008 | Miyamoto | 257/738 |

FOREIGN PATENT DOCUMENTS

| | | |
|---|---|---|
| EP | 0 186 818 A2 | 7/1986 |
| JP | 2003-324128 A | 11/2003 |
| KR | 10-2004-0069827 A | 8/2004 |
| KR | 10-2008-0095290 A | 10/2008 |

* cited by examiner

*Primary Examiner* — Xiaoliang Chen
(74) *Attorney, Agent, or Firm* — Sughrue Mion, PLLC

(57) ABSTRACT

A device-embedded flexible printed circuit board (FPCB) and a method of manufacturing the device-embedded FPCB are provided. The device-embedded FPCB includes: a first conductive layer; a first insulating layer which is disposed on the first conductive layer and includes at least one bump hole and at least one groove; a first plating layer which is formed in the at least one groove of the first insulating layer; and a device which includes at least one bump which is inserted into the at least one bump hole to be connected to the first conductive layer.

14 Claims, 6 Drawing Sheets

DEVICE-EMBEDDED FLEXIBLE PRINTED CIRCUIT BOARD AND MANUFACTURING METHOD THEREOF

CROSS-REFERENCE TO RELATED PATENT APPLICATION

This application claims priority from Korean Patent Application No. 10-2010-0079286, filed on Aug. 17, 2010, the disclosure of which is incorporated herein in its entirety by reference.

BACKGROUND

1. Field

Apparatuses and methods consistent with exemplary embodiments relate to a flexible printed circuit board (FPCB), and more particularly, to a device-embedded FPCB including a device.

2. Description of the Related Art

A large number of parts need to be installed in a small-size printed circuit board (PCB) with small-size and high-performance electronic devices disposed thereon. A method of installing various types of devices, in particular, active elements, into a flexible printed circuit board (FPCB) has been widely used as a method of installing a large number of parts in a small-size PCB.

Such a device-embedded FPCB can improve the integration of parts, shorten the lengths of wires, and improve its electrical performance. Also, the number of assembling processes is reduced, and a disposition margin of parts is increased, thereby improving a design freedom degree.

Advantages of the device-embedded FPCB increase with a decrease in a thickness of the device-embedded FPCB. This is because of the fact that as the thickness of the device-embedded FPCB becomes thinner, a size of the device-embedded FPCB decreases, a response time improves with the reductions in the lengths of the wires, and power consumption is reduced. Also, the flexibility of the device-embedded FPCB also increases with the decrease in the thickness of the device-embedded FPCB. As a result, the device-embedded FPCB is easily disposed.

SUMMARY

One or more of exemplary embodiments provide a device-embedded FPCB capable of improving integration of parts and effectively reducing a thickness thereof, and a method of manufacturing the device-embedded FPCB.

According to an aspect of an exemplary embodiment, there is provided a device-embedded FPCB including: a first conductive layer; a first insulating layer which is disposed on the first conductive layer and comprises at least one bump hole and at least one groove; a first plating layer which is formed in the at least one groove of the first insulating layer; and a device which comprises at least one bump which is inserted into the at least one bump hole to be connected to the first conductive layer.

The first conductive layer may include a copper layer of a flexible copper clad laminate (FCCL), and the first insulating layer may include a core layer of the FCCL.

The device-embedded FPCB may further include: a second insulating layer which is disposed on the first insulating layer and covers the device; a second conductive layer which is disposed on the second insulating layer; at least one via-hole which is formed in the second conductive layer and the second insulating layer, and reaches the first plating layer; and a second plating layer which is formed in the at least one via-hole to electrically connect the second conductive layer to the first plating layer.

The second insulating layer may include a resin layer of a resin-coated copper foil (RCC), and the second conductive layer may include a copper layer of the RCC.

The second conductive layer may include a copper layer of a FCCL which includes a core layer adhering onto the second insulating layer.

The second insulating layer may be a bonding sheet.

The device-embedded FPCB may further include protective layers which are respectively disposed underneath the first conductive layer and on the second conductive layer.

The device-embedded FPCB may further include at least one conductive ball which is disposed in the at least one bump hole and electrically connects the at least one bump to the first conductive layer.

The device-embedded FPCB may further include an adhesive material which is disposed between the device and the first insulating layer to fix the device onto the first insulating layer.

According to an aspect of another exemplary embodiment, there is provided a method of manufacturing a device-embedded FPCB, including: forming at least one bump hole in a first insulating layer disposed on a first conductive layer and forming at least one groove; disposing a plating resist on the at least one bump hole to cover the at least one bump hole and performing plating to form a plating layer as the first circuit pattern in the at least one groove; removing the plating resist; and disposing a device comprising at least one bump which is inserted into the at least one bump hole.

The method may further include: disposing a second insulating layer on the first insulating layer to cover the device and disposing a second conductive layer on the second insulating layer; forming at least one via-hole which penetrates the second conductive layer and the second insulating layer and reaches the first plating layer; and forming a second plating layer in the at least one via-hole to electrically connect the second conductive layer to the first plating layer.

The method may further include respectively disposing protective layers underneath the first conductive layer and on the second conductive layer.

Between removing the plating resist and disposing the device on the first insulating layer, the method may further include disposing at least one conductive ball in the at least one bump hole to electrically connect the at least one bump of the device to the first conductive layer.

Between removing the plating resist and disposing the device on the first insulating layer, the method may further include coating an adhesive material on a portion of the first insulating layer in which the at least one bump hole has been formed.

BRIEF DESCRIPTION OF THE DRAWINGS

The above and other aspects will become more apparent by describing in detail exemplary embodiments with reference to the attached drawings, in which.

DETAILED DESCRIPTION OF EXEMPLARY EMBODIMENTS

A device-embedded flexible printed circuit board (FPCB) according to an exemplary embodiment will now be described with reference to the attached drawings.

Figure 10:
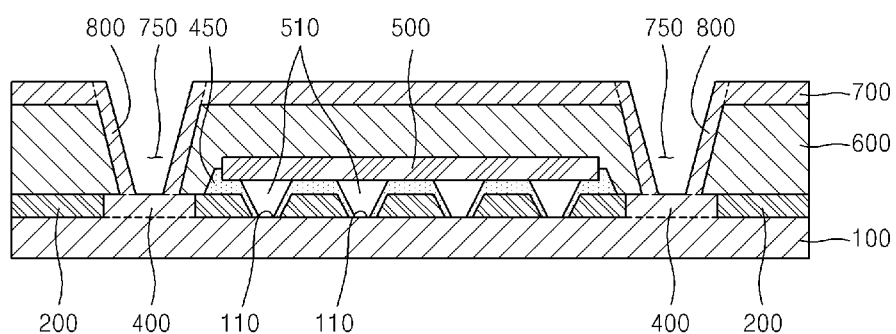
Figure 11:
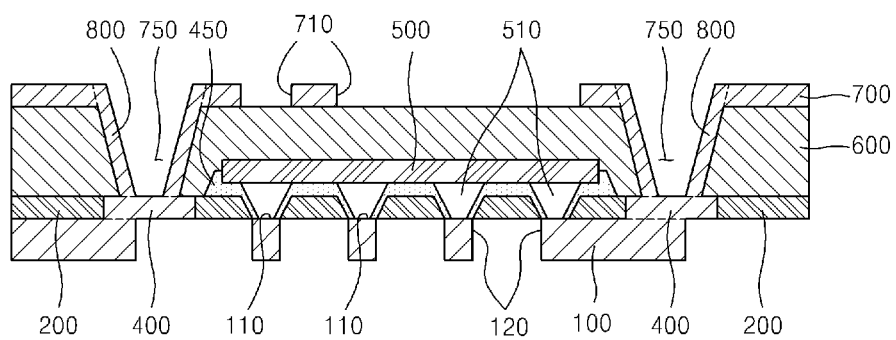
Figure 12:
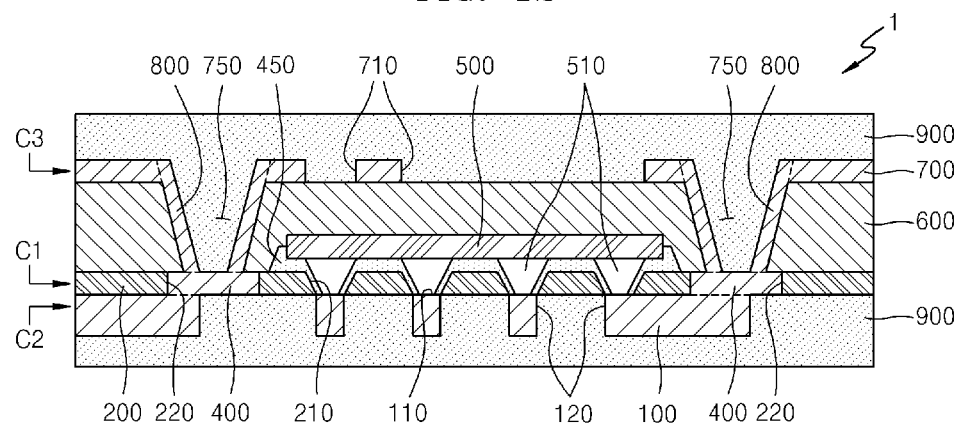
Figure 13:
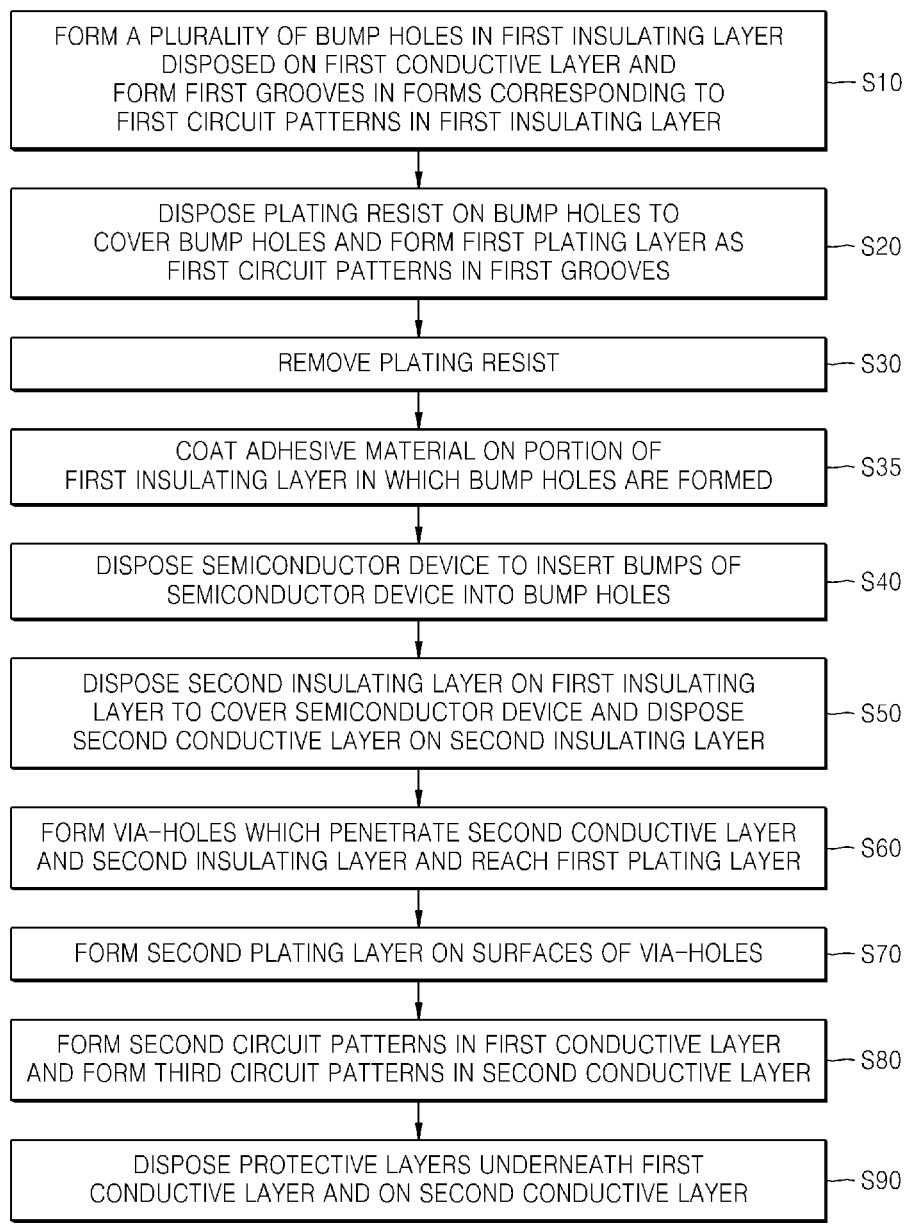
FIG. 13 is a flowchart of the method of FIGS. 1 through 12, according to an exemplary embodiment.

FIGS. 1 through 12 are schematic cross-sectional views sequentially illustrating a method of manufacturing a device-embedded FPCB 1, according to an exemplary embodiment. In particular, FIG. 12 is a schematic cross-sectional view of the device-embedded FPCB 1 which has been completely manufactured. FIG. 13 is a flowchart of the method of FIGS. 1 through 12.

Referring to FIG. 12, the device-embedded FPCB 1 according to the present exemplary embodiment includes a first conductive layer 100, a first insulating layer 200, a first plating layer 400, a semiconductor device 500, a second insulating layer 600, a second conductive layer 700, via-holes 750, a second plating layer 800, and protective layers 900.

The first conductive layer 100 is formed of a copper (Cu) material and has a thin thickness between 10 μm and 20 μm.

The first insulating layer 200 is disposed on the first conductive layer 100 and has a very thin thickness between 5 μm and 15 μm. The first insulating layer 200 may be formed of a polyimide material which has high insulating, flexibility, heat-resistant characteristics.

Bump holes 210 and first grooves 220 are formed in the first insulating layer 200. The bump holes 210 are holes into which bumps 510 of the semiconductor device 500 are to be inserted. Thus, the bump holes 210 in plurality are formed in forms corresponding to the bumps 510 of the semiconductor device 500. Also, the bump holes 210 expose parts of the first conductive layer 100. In other words, the parts of the first conductive layer 100 exposed through the first insulating layer 200 by the bump holes 210 become bump pads 110.

The first grooves 220 are adjacent to the bump holes 210 and are formed to correspond to a predetermined pattern, i.e., a first circuit pattern, in the first insulating layer 200. Second grooves 120 are formed in a predetermined form in the first conductive layer 100 to form a second circuit pattern.

The first plating layer 400 is formed in inner spaces of the first grooves 220 of the first insulating layer 200, and is formed of a Cu material like the first conductive layer 100. The first plating layer 400 has the same thickness as the first insulating layer 200 so as not to have a step difference with the first insulating layer 200. The first plating layer 400 is formed in the first grooves 220 by plating, and thus, is formed as the first circuit patterns according to the forms of the first grooves 220.

The semiconductor device 500 includes the bumps 510, and is disposed above the first insulating layer 200. The bumps 510 of the semiconductor device 500 are inserted into the bump holes 210 to be connected to the bump pads 110, and thus, are connected to the second circuit pattern of the first conductive layer 100. The semiconductor device 500 may have a very thin thickness between 50 μm and 100 μm. An adhesive material 450 is disposed between the semiconductor device 500 and the first insulating layer 200 to stably adhere and fix the semiconductor device 500 onto the first insulating layer 200. The adhesive material 450 may be an epoxy-based anisotropic conductive paste (ACP) or a non-conductive paste (NCP).

The second insulating layer 600 is disposed on the first insulating layer 200 to cover and seal the semiconductor device 500. The second insulating layer 600 may be formed thicker than the semiconductor device 500 to cover the semiconductor device 500, i.e., may be formed a little more thicker than the semiconductor device 500 so that a whole thickness of the device-embedded FPCB 1 does not become thicker. For example, if the semiconductor device 500 has a thickness of about 50 μm, the second insulating layer 600 may be formed to a thickness between 70 μm and 80 μm.

The second insulating layer 600 may be formed of a bonding sheet or a paste type adhesive.

The second conductive layer 700 is disposed on the second insulating layer 600, and is formed of a Cu material to a very thin thickness between 10 μm and 20 μm like the first conductive layer 100. Grooves 710 are formed in the second conductive layer 700 to form third circuit patterns.

The via-holes 750 are formed in the second conductive layer 700 and the second insulating layer 600, and reach the first plating layer 400.

The second plating layer 800 is formed on inner surfaces of the via-holes 750, and electrically connects the second conductive layer 700 to the first plating layer 400. The second plating layer 800 is formed of a Cu material like the first plating layer 400.

The protective layers 900 are respectively disposed underneath the first conductive layer 100 and on the second conductive layer 700 to protect the semiconductor device 500 and circuits which are disposed between the protective layers 900. The protective layers 900 may be formed of a cover lay which is a circuit protecting insulating film.

As described above, the device-embedded FPCB 100 according to the present exemplary embodiment includes three circuit layers C1, C2, and C3 which are respectively formed of the first, second, and third circuit patterns. The circuit layers C1, C2, and C3 are connected to one another, in particular, the circuit layer C1 of the first insulating layer 200 surface-contacts the circuit layer C2 of the first conductive layer 100 without via-holes.

A method of manufacturing the device-embedded FPCB 1 will now be described.

Figure 1:
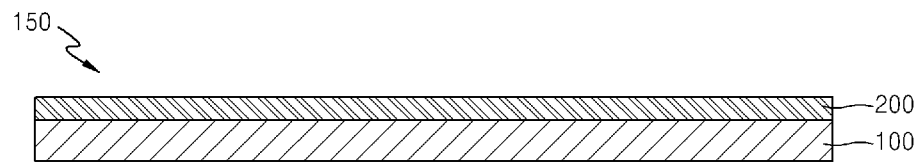
FIGS. 1 through 12 are schematic cross-sectional views sequentially illustrating a method of manufacturing a device-embedded flexible printed circuit board (FPCB), according to an exemplary embodiment.

As shown in FIG. 1, a raw material is provided, wherein the first conductive layer 100 is disposed as a lower part of the raw material, and the first insulating layer 200 is formed as an upper part of the raw material. In the present exemplary embodiment, a flexible copper clad laminate (FCCL) 150 may be used as the raw material. Specifically, a copper layer of the FCCL 150 is the first conductive layer 100, and a core layer formed of a polyimide material in the FCCL 150 is the first insulating layer 200.

Figure 2:
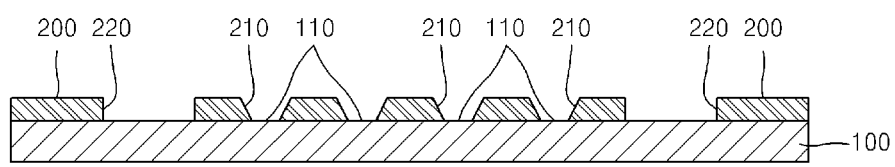

As shown in FIG. 2, in operation S10, the bump holes 210 and the first grooves 220 of the first circuit patterns are formed in the first insulating layer 200. A $CO_2$ laser may be used to form the bump holes 210 and the first grooves 220 in the first insulating layer 200. Parts of the first conductive layer 100 are exposed to correspond to the bumps 510 of the semiconductor device 500 due to the formation of the bump holes 210, thereby forming the bump pads 110.

Figure 3:
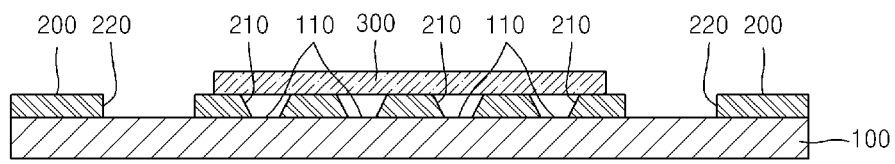
Figure 4:
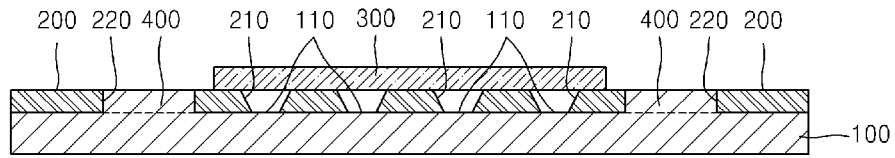

As shown in FIG. 3, in operation S20, a plating resist 300 is disposed on the first insulating layer 200 to cover the bump holes 210, and then, electrolysis plating is performed to form the first plating layer 400, as shown in FIG. 4. Since the plating resist 300 is disposed on the bump holes 210, the first plating layer 400 is not formed in the bump holes 210. The electrolysis plating is performed until the first plating layer 400 has the same thickness as the first insulating layer 200.

Figure 5:
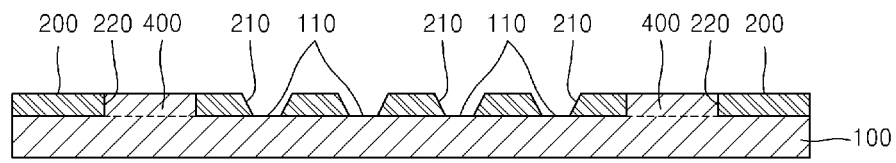
Figure 6:
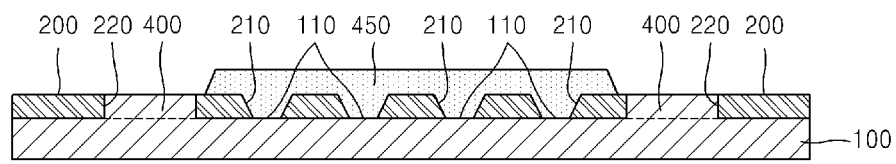

In operation S30, the plating resist 300 is removed as shown in FIG. 5. In operation S35, the adhesive material 450, formed of the epoxy-based ACP or NCP, is coated on a portion of the first insulating layer 200 in which the bump holes 210 have been formed, as shown in FIG. 6.

Figure 7:
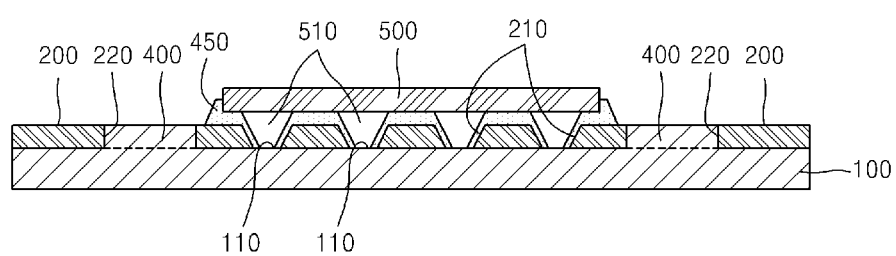

As shown in FIG. 7, in operation S40, the semiconductor device 500 having the bumps 510 is disposed on the first insulating layer 200 coated with the adhesive material 450 such that the bumps 510 are inserted into the bump holes 210 to contact the bump pads 110, and thus, are electrically connected to the first conductive layer 100.

Figure 8A:
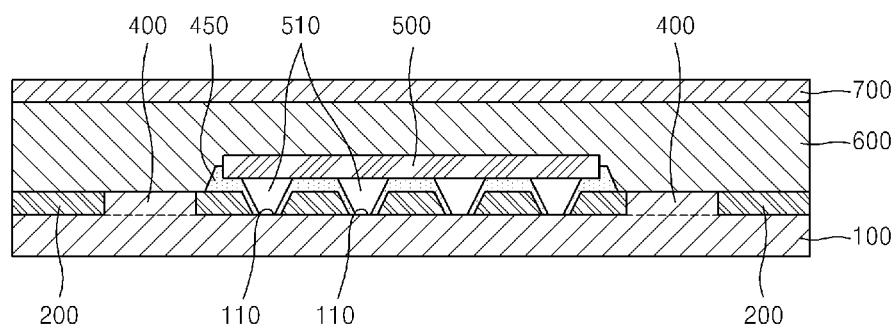

As shown in FIG. 8A, in operation S50, the second insulating layer 600 is disposed on the first insulating layer 200 to cover and seal the semiconductor device 500, and the second conductive layer 700 is disposed on the second insulating layer 600. The second insulating layer 600 may be formed using a bonding sheet. In other words, the bonding sheet, which is in a half-hardened state of a B-stage, may be heated, pressed, and adhered onto the semiconductor device 500 and the first insulating layer 200 using a roller or the like, thereby forming the second insulating layer 600.

The second insulating layer 600 may be formed of a paste type adhesive. In this case, a spray method may be used to spray the paste type adhesive to a predetermined thickness.

Figure 8B:
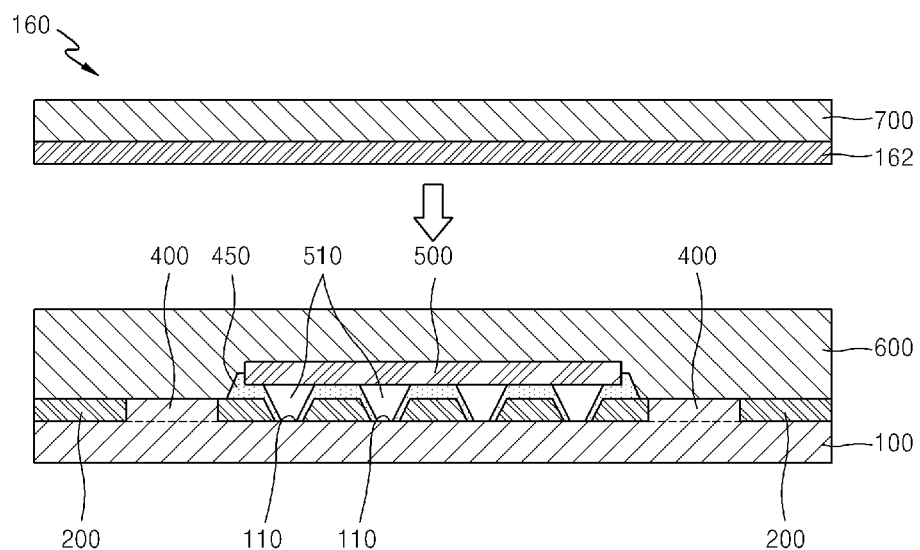

When the second insulating layer 600 is completely formed using the bonding sheet or the paste type adhesive, the second conductive layer 700 is disposed on the second insulating layer 600. The second conductive layer 700 is a thin film formed of a Cu material like the first conductive layer 100, and may be adhered onto the second insulating layer 600 with an adhesive material (not shown). An FCCL 160 as shown in FIG. 8B may be used to dispose the second conductive layer 700 on the second insulating layer 600. In other words, as shown in FIG. 8B, a core layer 162 of the FCCL 160 may be adhered onto the second insulating layer 600 to dispose the second conductive layer 700 on the second insulating layer 600.

In the present exemplary embodiment, the second conductive layer 700 has been disposed on the second insulating layer 600 through an additional process after the second insulating layer 600 is formed. However, the second insulating layer 600 and the second conductive layer 700 may be formed in a single process. For example, a resin layer of a resin-coated copper foil (RCC) faces the second insulating layer 600, and then, undergoes vacuum-laminating, thereby disposing the second insulating layer 600 and the second conductive layer 700 simultaneously. In other words, the resin layer of the RCC becomes the second insulating layer 600, and a copper thin film of the RCC becomes the second conductive layer 700.

Figure 9:
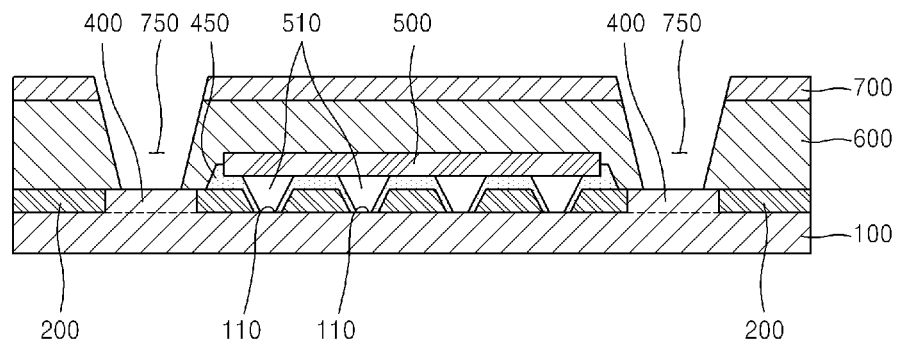

As shown in FIG. 9, in operation S60, the via-holes 750 are formed in the second conductive layer 700 and the second insulating layer 600 by using a $CO_2$ laser. In this case, the via-holes 750 are formed to depths until the first conductive layer 400 is exposed.

As shown in FIG. 10, in operation S70, the second plating layer 800 is formed on inner surfaces of the via-holes 750. Since parts of the inner surfaces of the via-holes 750 are formed of the second insulating layer 600 formed of an insulating material, electro less copper plating is performed, and then, electrolysis copper plating is performed to form the second plating layer 800. Since the second plating layer 800 is formed on the inner surfaces of the via-holes 750 which reach the first plating layer 400, the first plating layer 400 is electrically connected to the second conductive layer 700 through the second plating layer 800.

As shown in FIG. 11, in operation S80, the first conductive layer 100 is patterned into the second circuit patterns, and the second conductive layer 700 is patterned into the third circuit patterns. A general etching process may be used to pattern the first and second conductive layers 100 and 700. In other words, the second and third circuit patterns may be respectively formed in the first and second conductive layers 100 and 700 through a photolithography process.

As shown in FIG. 12, in operation S90, a coverlay film, which is a circuit protecting insulating film, is adhered underneath the first conductive layer 100 and on the second conductive layer 700 to dispose the protective layers 900. When the protective layers 900 are completely disposed, the device-embedded FPCB 1 of the present exemplary embodiment is completely manufactured.

As described above, in the device-embedded FPCB 1 of the present exemplary embodiment, the bump pads 110 are formed using the same method in which the bump holes 210 are formed in the first insulating layer 200. Thus, an additional circuit layer for forming the bump pads 110 is not required. Therefore, the thickness of the device-embedded FPCB 1 is effectively reduced.

Since the bumps 510 of the semiconductor device 500 are inserted into the bump holes 210, the thickness of the device-embedded FPCB 1 is further reduced by the insertion depths of the bumps 510.

Since a circuit having the first circuit patterns is formed in the first insulating layer 200, the thickness of the device-embedded FPCB 1 is not additionally increased. Thus, the integration of the device-embedded FPCB 1 is effectively improved, and the device-embedded FPCB 1 is effectively made thin.

The circuit layer C1 of the first insulating layer 200 surface-contacts the circuit layer C2 of the first conductive layer 100 without via-holes. Thus, the electrical performance of the device-embedded FPCB 1 is improved, and power consumption of the device-embedded FPCB 1 is reduced.

A device-embedded FPCB 2 according to another exemplary embodiment will now be described with reference to FIG. 14.

Figure 14:
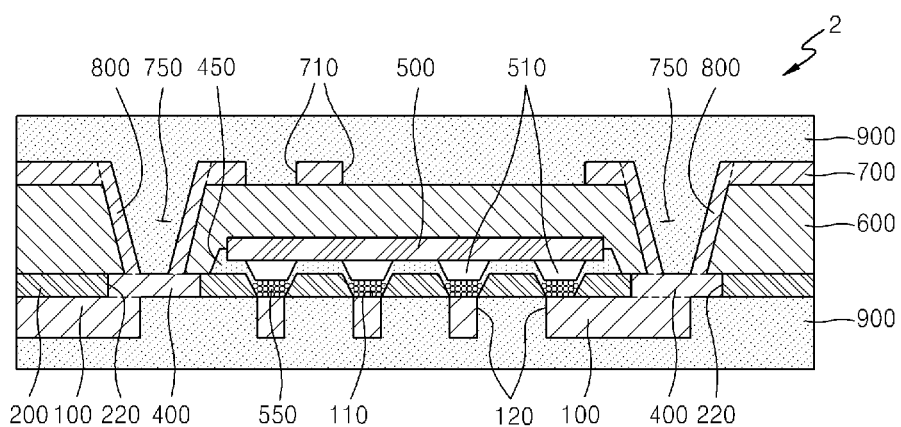
FIG. 14 is a schematic cross-sectional view of a device-embedded FPCB according to another exemplary embodiment.

FIG. 14 is a schematic cross-sectional view of the device-embedded FPCB 2 according to another exemplary embodiment.

Referring to FIG. 14, like the device-embedded FPCB 1 of FIG. 12, the device-embedded FPCB 2 includes a first conductive layer 100, a first insulating layer 200, a first plating layer 400, a semiconductor device 500, a second insulating layer 600, a second conductive layer 700, via-holes 750, a second plating layer 800, and protective layers 900. However, the device-embedded FPCB 2 further includes a plurality of conductive balls 550, in comparison to the device-embedded FPCB 1 of FIG. 12.

The conductive balls 550 are disposed in bump holes (210 (not shown)) to electrically connect bumps 510 of the semiconductor device 500 to the first conductive layer 100.

In the device-embedded FPCB 2 of the present exemplary embodiment, even if each of the vertical and horizontal lengths of the bumps 510 of the semiconductor device 500 is smaller than a thickness of the first insulating layer 200, the conductive balls 550 may be filled between bump pads 110 and the bumps 510. Thus, the bumps 510 may be easily connected to the bump pads 110.

The device-embedded FPCBs 1 and 2 and their manufacturing methods have been described, but the inventive concept is not limited thereto. Various changes in form and details may be made therein without departing from the spirit and scope of the inventive concept.

For example, the device-embedded FPCBs 1 and 2 include first, second, and third circuit layers C1, C2, and C3, but may not include the third circuit layer C3. In other words, the device-embedded FPCBs 1 and 2 may include only the first and second circuit layers C1 and C2 without the second conductive layers 700.

The first and second conductive layers 100 and 700 and the first and second plating layers 400 and 800 are formed of Cu materials, but may be formed of other metal materials.

The thickness of the first plating layer 400 is equal to the thickness of the first insulating layer 200, but may be thinner than the thickness of the first insulating layer 200.

As described above, a device-embedded FPCB according to the inventive concept may improve integration thereof, effectively reduce thickness thereof, and effectively improve electrical performance and flexibility thereof.

While exemplary embodiments have been particularly shown and described, it will be understood by those of ordinary skill in the art that various changes in form and details may be made therein without departing from the spirit and scope of the inventive concept as defined by the following claims.

What is claimed is:

1. A method of manufacturing a device-embedded flexible printed circuit board, the method comprising:
    forming at least one bump hole in a first insulating layer disposed on a first conductive layer and forming at least one groove;
    disposing a plating resist on the at least one bump hole to cover the at least one bump hole and performing plating to form a plating layer in the at least one groove;
    removing the plating resist; and
    disposing a device comprising at least one bump which is inserted into the at least one bump hole.

2. The method of claim 1, wherein the first conductive layer comprises a copper layer of a flexible copper clad laminate (FCCL), and the first insulating layer comprises a core layer of the FCCL.

3. The method of claim 1, further comprising:
    disposing a second insulating layer on the first insulating layer to cover the device and disposing a second conductive layer on the second insulating layer;
    forming at least one via-hole which penetrates the second conductive layer and the second insulating layer and reaches the first plating layer; and
    forming a second plating layer in the at least one via-hole to electrically connect the second conductive layer to the first plating layer.

4. The method of claim 3, wherein the at least one groove is formed corresponding to a first circuit pattern, and thus, the first plating layer is formed as the first circuit pattern, and
    wherein the method further comprising:
    forming a second circuit pattern in the first conductive layer; and
    forming a third circuit pattern in the second conductive layer.

5. The method of claim 3, wherein the second insulating layer comprises a resin layer of a resin-coated copper foil (RCC), and the second conductive layer comprises a copper layer of the RCC.

6. The method of claim 3, wherein the second conductive layer comprises a copper layer of a flexible copper clad laminate (FCCL) which comprises a core layer adhering onto the second insulating layer.

7. The method of claim 3, wherein the second insulating layer is a bonding sheet.

8. The method of claim 3, further comprising respectively disposing protective layers underneath the first conductive layer and on the second conductive layer.

9. The method of claim 1, between removing the plating resist and disposing the device on the first insulating layer, further comprising disposing at least one conductive ball in the at least one bump hole to electrically connect the at least one bump of the device to the first conductive layer.

10. The method of claim 1, between removing the plating resist and disposing the device on the first insulating layer, further comprising coating an adhesive material on a portion of the first insulating layer in which the at least one bump hole has been formed.

11. The method of claim 1, further comprising connecting the first conductive layer to the first plating layer through the at least one groove.

12. The method of claim 1, wherein the at least one groove is formed corresponding to a first circuit pattern, and thus, the first plating layer is formed as the first circuit pattern.

13. The method of claim 12, further comprising forming a second circuit pattern in the first conductive layer.

14. The method of claim 13, further comprising forming a third circuit pattern in the second conductive layer.

* * * * *